(12) United States Patent
Wang

(10) Patent No.: US 10,366,636 B2
(45) Date of Patent: Jul. 30, 2019

(54) MANUFACTURING METHOD OF FLEXIBLE BACKPLATE, LIQUID CRYSTAL DISPLAY PANEL, AND ORGANIC LIGHT-EMITTING DIODEDISPLAY PANEL

(71) Applicant: Wuhan China Star Optoelectronics Semiconductor Display Technology Co., Ltd., Wuhan, Hubei (CN)

(72) Inventor: Guochao Wang, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/736,619

(22) PCT Filed: Sep. 14, 2017

(86) PCT No.: PCT/CN2017/101671
§ 371 (c)(1),
(2) Date: Dec. 14, 2017

(87) PCT Pub. No.: WO2019/000651
PCT Pub. Date: Jan. 3, 2019

(65) Prior Publication Data
US 2019/0005856 A1 Jan. 3, 2019

(30) Foreign Application Priority Data

Jun. 28, 2017 (CN) .......................... 2017 1 0511539

(51) Int. Cl.
*H01L 51/00* (2006.01)
*G09F 9/30* (2006.01)
(Continued)

(52) U.S. Cl.
CPC ........ *G09F 9/301* (2013.01); *G02F 1/133305* (2013.01); *H01L 27/3258* (2013.01);
(Continued)

(58) Field of Classification Search
CPC ............. H01L 27/1214; H01L 51/0508; H01L 29/78603; H01L 2227/323; H01L 27/1262; H01L 27/1218
See application file for complete search history.

(56) References Cited

U.S. PATENT DOCUMENTS

2016/0336385 A1* 11/2016 Li ........................ H01L 27/3258
* cited by examiner

*Primary Examiner* — Roy K Potter
(74) *Attorney, Agent, or Firm* — Andrew C. Cheng

(57) ABSTRACT

The present invention discloses a manufacturing method of flexible backplate, a liquid crystal display panel, and an OLED display panel. The method comprises: providing a substrate; forming a buffer layer, an active layer, and a gate insulating layer on the substrate; forming a gate on the gate insulating layer, and forming an etching stopper layer; forming a second insulating layer on the gate and the etching stopper layer; forming a first through hole in the isolation region, and forming a second through hole in the bonding region; coating an organic material on the second insulating layer and filling the organic material in the first and second through holes to form an organic filling layer; forming a source and a drain on the organic filling layer. By the above way, it does not damage the active layer during the etching process without adding any processes, and improve flexibility of the backplate.

12 Claims, 5 Drawing Sheets

(51) Int. Cl.
*G02F 1/1333* (2006.01)
*H01L 27/32* (2006.01)
*H01L 51/56* (2006.01)

(52) U.S. Cl.
CPC .......... *H01L 51/0097* (2013.01); *H01L 51/56* (2013.01); *H01L 2227/323* (2013.01); *H01L 2251/5338* (2013.01)

MANUFACTURING METHOD OF FLEXIBLE BACKPLATE, LIQUID CRYSTAL DISPLAY PANEL, AND ORGANIC LIGHT-EMITTING DIODEDISPLAY PANEL

FIELD OF THE INVENTION

The present invention relates to a technology of display, and more particularly, to a manufacturing method of flexible backplate, a liquid crystal display panel, and an organic light-emitting diode (OLED) display panel.

DESCRIPTION OF PRIOR ART

With the active matrix organic light-emitting diode (AMOLED) display technology more and more mature in the industry, the display requirement of portable electronic device has gradually become a flexible AMOLED display requirement. The flexible OLED display has more thin, lower power consumption, can be bent into any shape to meet the market requirement for wearable equipment and other advantages.

In order to make the panel more flexible, the panel will be perforated, and filled with organic materials in the hole to enhance the flexibility of the panel. But during the perforating, it will damage to the active layer due to a little careless, so as to reduce product yield.

SUMMARY OF THE INVENTION

The technical problem that the present invention mainly solves is to provide a manufacturing method of flexible backplate, a liquid crystal display panel, and an OLED display panel. On the one hand, it does not damage the active layer during the etching process without adding any processes, on the other hand, it can improve the flexibility of the backplate.

In order to solve the above-mentioned technical problem, a technical solution adopted by the present invention is to provide a manufacturing method of flexible backplate, which comprising a plurality of pixel regions, an isolation region between the plurality of pixel regions, and a bonding region, wherein the manufacturing method comprises: providing a substrate; forming a buffer layer, an active layer, and a gate insulating layer sequentially on the substrate; forming a gate on the gate insulating layer corresponding to the pixel region, and forming an etching stopper layer corresponding to the isolation region; forming a second insulating layer on the gate and the etching stopper layer; forming a first through hole in the isolation region by a first etching process on the second insulating layer, and forming a second through hole in the bonding region, wherein the bottom of the first through hole is located on the etching stopper layer and the bottom of the second through hole is located on the substrate; coating an organic material on the second insulating layer and filling the organic material in the first through hole and the second through hole to form an organic filling layer; forming a source and a drain on the organic filling layer, wherein the source is connected to a source region of the active layer, and the drain is connected to a drain region of the active layer.

In order to solve the above-mentioned technical problem, another technical solution adopted by the present invention is to provide a liquid crystal display panel, which comprising an array substrate, a color film substrate, and a liquid crystal layer between the array substrate and the color film substrate, wherein the array substrate comprises a backplate and an electrode layer, and the backplate is formed by the above-mentioned manufacturing method.

In order to solve the above-mentioned technical problem, another technical solution adopted by the present invention is to provide an OLED display panel, which comprising an upper substrate, a lower substrate, and a light emitting device between the upper substrate and the lower substrate, wherein the lower substrate comprises a backplate and an electrode layer, and the backplate is formed by the above-mentioned manufacturing method.

The present invention can be concluded with the following advantages, the method provided by the present invention is different from the prior art by providing a manufacturing method of flexible backplate, which comprising a plurality of pixel regions, an isolation region between the plurality of pixel regions, and a bonding region, wherein the manufacturing method comprises: providing a substrate; forming a buffer layer, an active layer, and a gate insulating layer sequentially on the substrate; forming a gate on the gate insulating layer corresponding to the pixel region, and forming an etching stopper layer corresponding to the isolation region; forming a second insulating layer on the gate and the etching stopper layer; forming a first through hole in the isolation region by a first etching process on the second insulating layer, and forming a second through hole in the bonding region; coating an organic material on the second insulating layer and filling the organic material in the first through hole and the second through hole to form an organic filling layer; forming a source and a drain on the organic filling layer. By the above way, on the one hand, it does not damage the active layer during the etching process without adding any processes, on the other hand, it can improve the flexibility of the backplate.

DESCRIPTION OF PREFERRED EMBODIMENT

Figure 1:
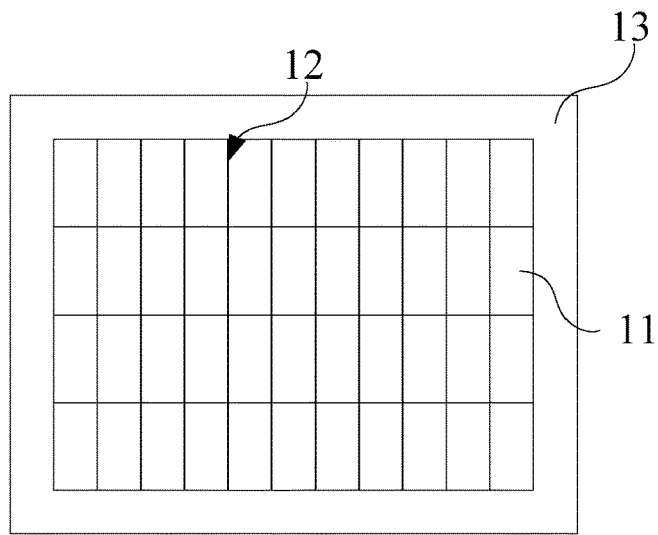
FIG. 1 is a structural illustration of a manufacturing method of flexible backplate in accordance with an embodiment in the present invention.

Referring to FIG. 1, FIG. 1 is a structural illustration of a manufacturing method of flexible backplate in accordance with an embodiment in the present invention. The flexible backplate comprises a plurality of pixel regions 11, an isolation region 12 between the plurality of pixel regions 11, and a bonding region 13.

Wherein, the plurality of pixel regions 11 are arrayed to form an active area (AA) of the backplane, and the isolation region 12 is between in the two adjacent pixel regions 11. It should be noticed that, the isolation region 12 is only used to isolate thin-film transistors of two pixels and does not separate the two pixels.

Wherein, the bonding region 13 is generally located at the edge of the display panel for setting various circuits, such as a driving circuit.

It should be understandable that, in the steps of the following embodiment, inter layer structure of the backplate can be made by physical vapor deposition or chemical vapor deposition, such as one or more of a method of physical sputtering, spin coating, ink jetting, slit coating, or photolithography, it is not limited thereto.

Figure 2:
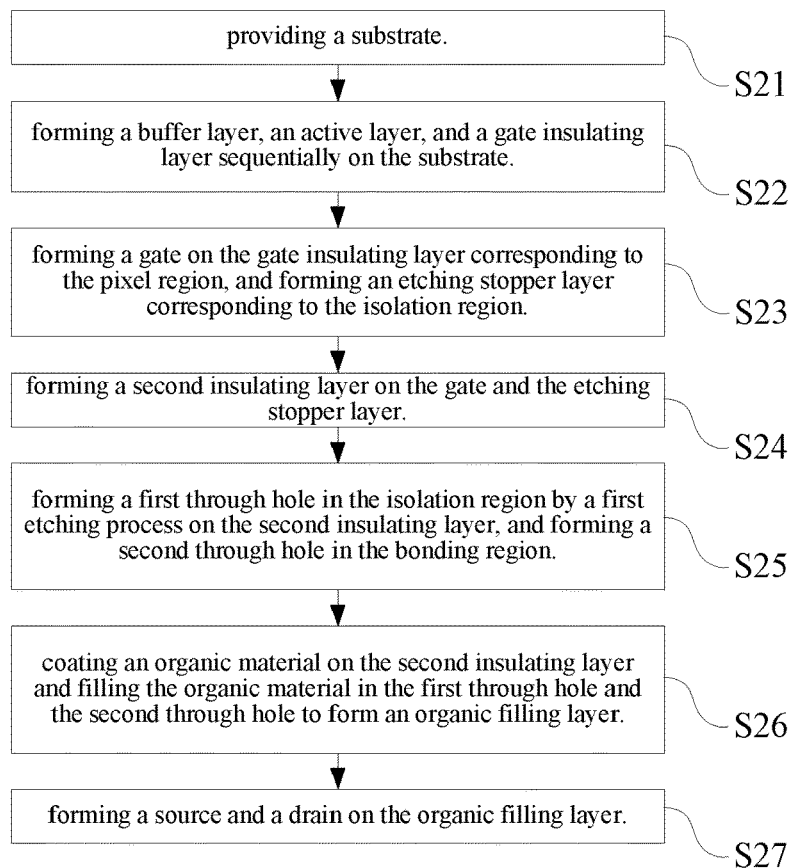
FIG. 2 is a flow chart of a manufacturing method of flexible backplate of an embodiment in the present invention.

As shown in FIG. 2, the manufacturing method comprises:

S21: providing a substrate.

S22: forming a buffer layer, an active layer, and a gate insulating layer sequentially on the substrate.

Wherein, the buffer layer is generally silicon oxide, silicon nitride or a mixture thereof, the active layer is generally doped polysilicon, and the gate insulating layer is generally also silicon oxide, silicon nitride or a mixture thereof. Specifically, in the embodiment, the step S22 may specifically comprises:

S221: forming a buffer layer on the substrate.

S221: forming an active layer on the buffer layer and doping the active layer to form the source region and the drain region on the active layer.

Specifically, depositing an amorphous silicon (a-Si) layer first and then converting an amorphous silicon layer into a polycrystalline silicon (poly-Si) layer by an excimer laser annealing (ELA) process, and then patterning and ion-doping the poly-Si layer to form an active layer including a source region and a drain region. In addition, it may also to pattern the amorphous silicon layer first, and then subjecting the patterned amorphous silicon to an excimer annealing process.

S223: forming a gate insulating layer on the active layer.

Figure 3:
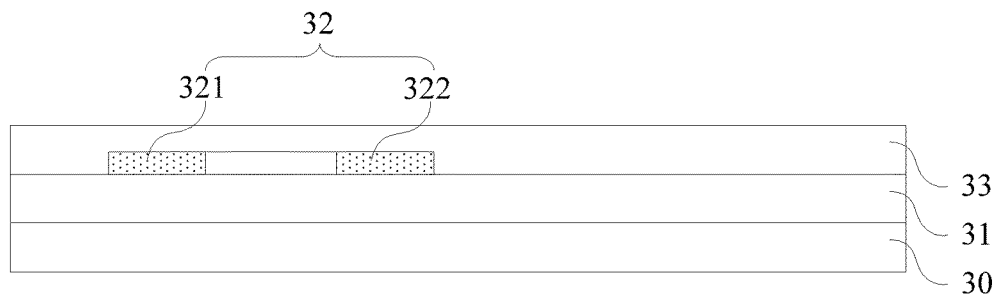
FIG. 3 is a structural illustration of steps S21-S22.

The above-mentioned steps S21-S22 may refer specifically to FIG. 3.

Forming the buffer layer 31 on the substrate 30 first, and depositing an amorphous silicon layer on the buffer layer 31, converting the amorphous silicon into poly-Si by an excimer annealing process after the amorphous silicon is patterned, doping the two sides of the poly-Si with ions (e.g., boron ions) to form the source region 321 and the drain region 322, so as to form the active layer 32. Finally, forming the gate insulating layer 33 on the active layer 32, and the gate insulating layer 33 covers the active layer 32 and the buffer layer 31.

S23: forming a gate on the gate insulating layer corresponding to the pixel region, and forming an etching stopper layer corresponding to the isolation region.

S24: forming a second insulating layer on the gate and the etching stopper layer.

Figure 4:
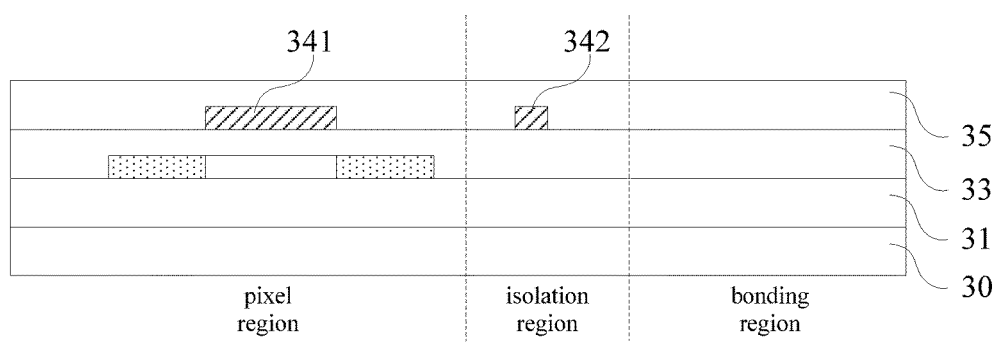
FIG. 4 is a structural illustration of steps S23-S24.

The above-mentioned steps S23-S24 may refer specifically to FIG. 4.

Forming a first metal layer on the gate insulating layer and patterning the first metal layer to form a gate 341 in the pixel region, and forming an etching stopper layer 342 in the isolation region.

Specifically, the gate 341 is arranged corresponding to the active region 13. Preferably, the width of the etching stopper layer 342 is smaller than the width of the isolation region. The width of the etching stopper layer 342 is smaller than the width of the isolation region.

S25: forming a first through hole in the isolation region by a first etching process on the second insulating layer, and forming a second through hole in the bonding region, wherein the bottom of the first through hole is located on the etching stopper layer and the bottom of the second through hole is located on the substrate.

Figure 5:
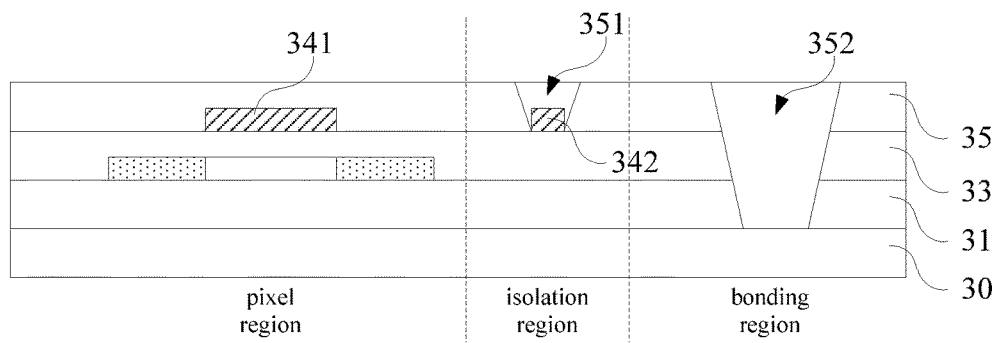
FIG. 5 is a structural illustration of step S25.

As showing FIG. 5. Specifically, a dry etching method may be used in the present embodiment, etching the backplate by using a first mask and a first gas. Because the isolation region is blocked by the etching stopper layer 342 and the first gas cannot etch the etching stopper layer 342. Therefore, when the isolation region is subjected to an etching process, portions below the etching stopper layer 342 cannot be etched; and the bonding region is not blocked, the first insulating layer 35, the gate insulating layer 33, and the buffer layer 31 can be etched sequentially. Therefore, the bottom of the first through hole 351 can only reach the etching stopper layer 342 and the bottom of the second through hole 352 can reach the substrate 30.

It should be noticed that, in the above-mentioned etching process, the first through hole 351 and the second through hole 352 are formed in the same gas and in the same etching process. Because of the existing etching stopper layer 342 in the first through hole 351, therefore, it may consider only the width and the depth of the second through hole 352 in the selection of the type of first gas and the etching time.

It should be understandable that, because the etching stopper layer 342 is above the gate insulating layer 33. Therefore, when the first through hole 351 is etched, even if the phenomenon of side etching occurs, it does not affect the active layer 32

By the above way, on the one hand, blocking the etching gas by the etching stopper layer, it can prevent the active layer from being damaged when the first through hole is etched, on the other hand, because only one mask is used in forming the gate 341 and the etching stopper layer 342, it is only necessary to modify the mask pattern, and when etching the first through hole and the second through hole, only one mask is required, therefore, no additional mask and additional process are added.

S26: coating an organic material on the second insulating layer and filling the organic material in the first through hole and the second through hole to form an organic filling layer.

Figure 6:
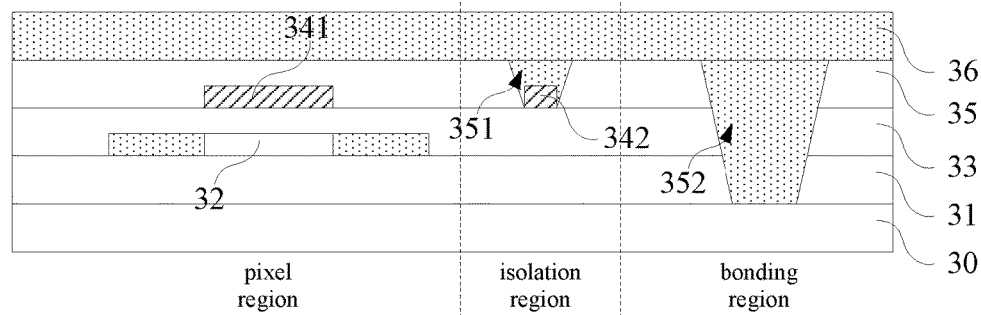
FIG. 6 is a structural illustration of step S26.

As shown in FIG. 6, the organic filling layer 36 is filled in the first through hole 351 and the second through hole 352, it can improve the flexibility of the backplane to increase the bending performance of the panel.

S27: forming a source and a drain on the organic filling layer, wherein the source is connected to a source region of the active layer, and the drain is connected to a drain region of the active layer.

Figure 7:
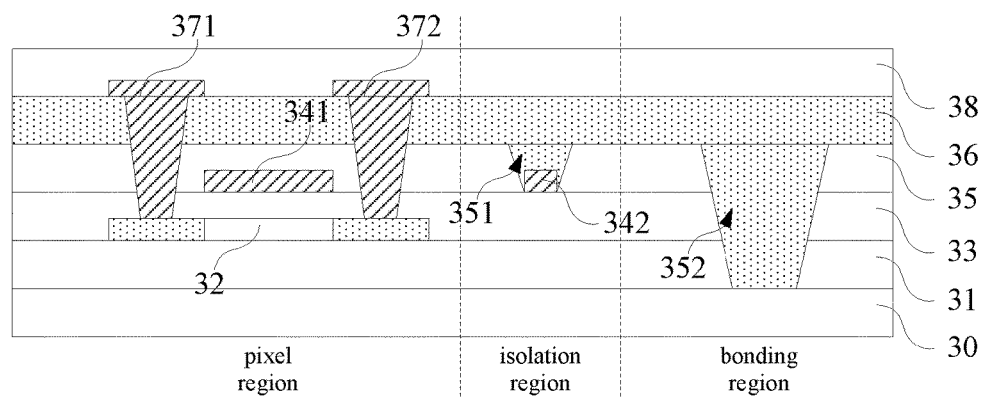
FIG. 7 is a structural illustration of step S27.

As shown in FIG. 7, forming a third through hole (not shown in figure) and a fourth through hole (not shown in figure) on the organic filling layer 36 by an etching process, wherein the third through hole exposes the source region in the active layer 32 and the fourth through hole exposes the drain region in the active layer 32; forming a second metal layer on the organic filling layer 36 and patterning the second metal layer to form a source 371 and a drain 372, wherein the source 371 is connected to the source region via the third through hole, the drain is connected to the drain 372 region via the fourth through hole.

In addition, a flat layer 38 may be formed on the source 371 and the drain 372 for flattening the surface of the back surface.

Figure 8:
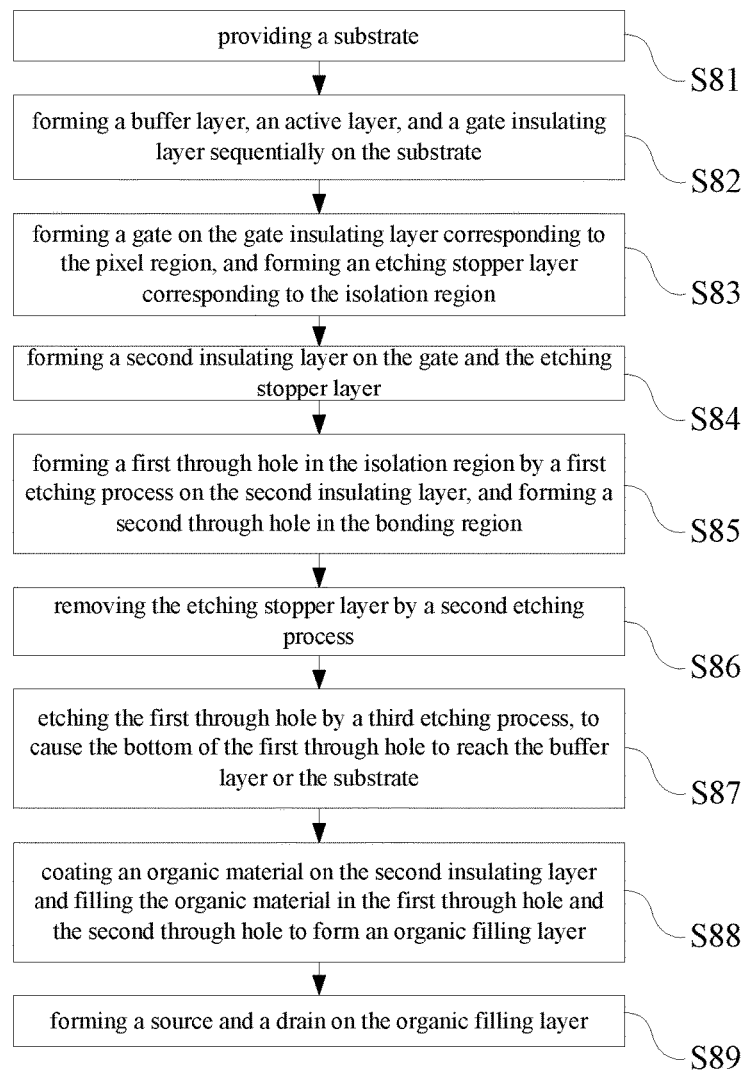
FIG. 8 is a structural illustration of a manufacturing method of flexible backplate in accordance with another embodiment in the present invention.

Referring to FIG. 8, FIG. 8 is a structural illustration of a manufacturing method of flexible backplate in accordance with another embodiment in the present invention, the method comprises:

S81: providing a substrate.

S82: forming a buffer layer, an active layer, and a gate insulating layer sequentially on the substrate.

S83: forming a gate on the gate insulating layer corresponding to the pixel region, and forming an etching stopper layer corresponding to the isolation region.

S84: forming a second insulating layer on the gate and the etching stopper layer.

S85: forming a first through hole in the isolation region by a first etching process on the second insulating layer, and forming a second through hole in the bonding region, wherein the bottom of the first through hole is located on the etching stopper layer and the bottom of the second through hole is located on the substrate.

S86: removing the etching stopper layer by a second etching process.

S87: etching the first through hole by a third etching process, to cause the bottom of the first through hole to reach the buffer layer or the substrate.

S88: coating an organic material on the second insulating layer and filling the organic material in the first through hole and the second through hole to form an organic filling layer.

S89: forming a source and a drain on the organic filling layer, wherein the source is connected to a source region of the active layer, and the drain is connected to a drain region of the active layer.

It is different from the above-described embodiment, the present embodiment adds two steps of S86 and S87.

Figure 9:
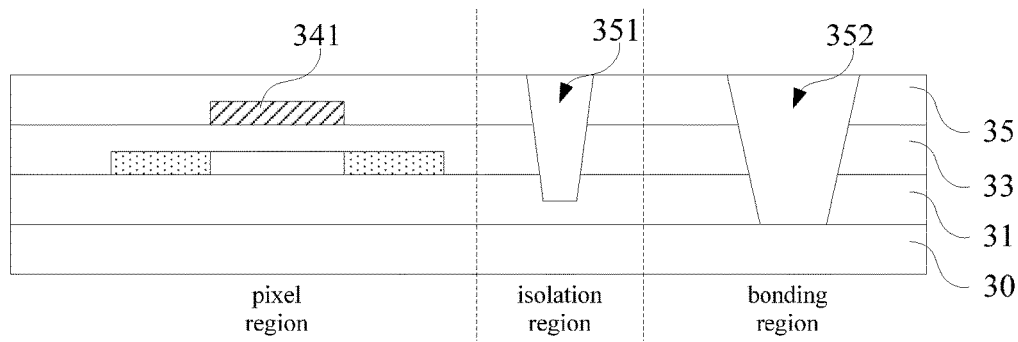
FIG. 9 is a structural illustration of steps S86-S87.

As shown in FIG. 9, removing the etching stopper layer by the second etching process after the first etching process. Then, etching the first through hole by the third etching process, to cause the bottom of the first through hole to reach the buffer layer 31 or the substrate 30.

It should be noticed that, in the third etching process, the used etching gas is different from the etching gas used in the first etching process. Specifically, the type or etching time of etching gas may be selected according to the specific purpose of each etching process. In the first etching process, because of the existing etching stopper layer, the etching gas is mainly selected according to the depth of the second through hole; in the second etching process, the etching gas is mainly selected a gas which can etch the etching stopper layer; in the third etching process, the etching gas is mainly selected according to the depth and width of the first through hole.

In the present embodiment, after the step S89, it is also to form a flat layer above the source and the drain, so that the surface of the backplate is flattened and facilitates subsequent operations.

Figure 10:
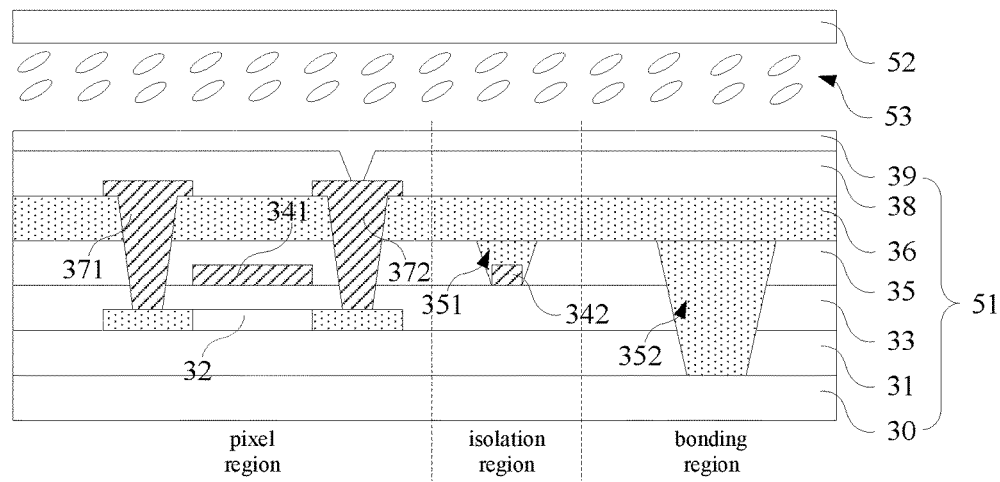
FIG. 10 is a structural illustration of a display panel in accordance with an embodiment in the present invention.

Referring to FIG. 10, FIG. 10 is a structural illustration of a display panel in accordance with an embodiment in the present invention. The display panel comprises an array substrate 51, a color film substrate 52, and a liquid crystal layer 53 between the array substrate 51 and the color film substrate 52.

Wherein the array substrate 51 comprises a backplate and an electrode layer 39, and the backplate is formed by the above-mentioned manufacturing method.

Wherein, the electrode layer 39 may be a pixel electrode, and a common electrode, a photoresist or the like, are further arranged on the color film substrate 52, and an electric field is formed between the common electrode and the pixel electrode to control the deflection of the liquid crystal molecules in the liquid crystal layer 53.

Wherein, the electrode layer 39 is connected to the drain 372 via a throughhole in the flat layer 38.

Figure 11:
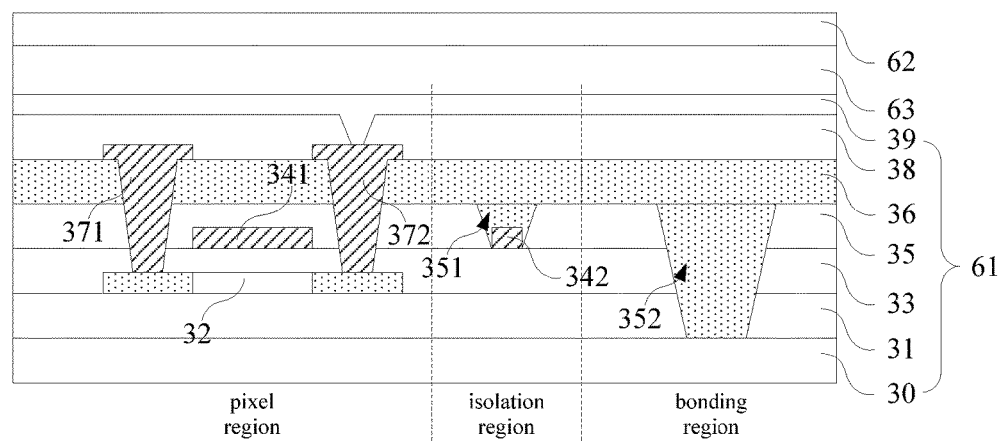
FIG. 11 is a structural illustration of an OLED display panel in accordance with an embodiment in the present invention.

Referring to the FIG. 11, FIG. 11 is a structural illustration of an OLED display panel in accordance with an embodiment in the present invention. The OLED display comprises a lower substrate 61, an upper substrate 62, and a light emitting device 63 between the upper substrate 62 and the lower substrate 61.

Wherein the lower substrate 61 comprises a backplate and an electrode layer 39, and the backplate is formed by the above-mentioned manufacturing method.

Wherein, the electrode layer 39 may be an anode, and a cathode is further arranged on the upper substrate 62, and the electrons of the anode and the cathode may be recombined in the light emitting layer 63 to cause the light emitting layer 63 to emit light.

In addition, a hole injection layer and a hole transport layer may be arranged between the anode and the light emitting layer 63, and an electron injection layer and an electron transport layer may be further arranged between the cathode and the light emitting layer 63.

In addition, the anode and cathode may also be displaced, i.e., the electrode layer 39 is the cathode.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

The invention claimed is:

1. A manufacturing method of flexible backplate, which comprising a plurality of pixel regions, an isolation region between the plurality of pixel regions, and a bonding region, wherein the manufacturing method comprises:

providing a substrate;

forming a buffer layer, an active layer, and a gate insulating layer sequentially on the substrate;

forming a gate on the gate insulating layer corresponding to the pixel region, and forming an etching stopper layer corresponding to the isolation region, wherein the width of the etching stopper layer is smaller than the width of the isolation region;

forming a second insulating layer on the gate and the etching stopper layer;

forming a first through hole in the isolation region by a first etching process on the second insulating layer, and forming a second through hole in the bonding region, wherein the bottom of the first through hole is located on the etching stopper layer and the bottom of the second through hole is located on the substrate;

removing the etching stopper layer by a second etching process;

etching the first through hole by a third etching process, to cause the bottom of the first through hole to reach the buffer layer or the substrate;

coating an organic material on the second insulating layer and filling the organic material in the first through hole and the second through hole to form an organic filling layer;

forming a source and a drain on the organic filling layer, wherein the source is connected to a source region of the active layer, and the drain is connected to a drain region of the active layer;

wherein the first etching process and the third etching process are dry etching, and the gas used in the first etching process and the third etching process are different.

2. The manufacturing method as recited in claim 1, wherein,
the above-mentioned description of forming a gate on the gate insulating layer corresponding to the pixel region and forming an etching stopper layer corresponding to the isolation region, which comprises:
forming a first metal layer on the gate insulating layer and patterning the first metal layer to form a gate in the pixel region, and forming an etching stopper layer in the isolation region.

3. The manufacturing method as recited in claim 1, wherein,
the above-mentioned description of forming a buffer layer, an active layer, and a gate insulating layer sequentially on the substrate, which comprises:
forming a buffer layer on the substrate;
forming an active layer on the buffer layer and doping the active layer to form the source region and the drain region on the active layer;
forming a gate insulating layer on the active layer.

4. The manufacturing method as recited in claim 1, wherein,
the above-mentioned description of forming a source and a drain on the organic filling layer, which comprises:
forming a third through hole and a fourth through hole on the organic filling layer by a fourth etching process, wherein the third through hole exposes the source region in the active layer and the fourth through hole exposes the drain region in the active layer;
forming a second metal layer on the organic filling layer and patterning the second metal layer to form a source and a drain, wherein the source is connected to the source region via the third through hole, the drain is connected to the drain region via the fourth through hole.

5. The manufacturing method as recited in claim 1, wherein which further comprises:
forming a flat layer on the source and the drain.

6. A manufacturing method of flexible backplate, which comprising a plurality of pixel regions, an isolation region between the plurality of pixel regions, and a bonding region, wherein the manufacturing method comprises:
providing a substrate;
forming a buffer layer, an active layer, and a gate insulating layer sequentially on the substrate;
forming a gate on the gate insulating layer corresponding to the pixel region, and forming an etching stopper layer corresponding to the isolation region;
forming a second insulating layer on the gate and the etching stopper layer;
forming a first through hole in the isolation region by a first etching process on the second insulating layer, and forming a second through hole in the bonding region, wherein the bottom of the first through hole is located on the etching stopper layer and the bottom of the second through hole is located on the substrate;
coating an organic material on the second insulating layer and filling the organic material in the first through hole and the second through hole to form an organic filling layer;
forming a source and a drain on the organic filling layer, wherein the source is connected to a source region of the active layer, and the drain is connected to a drain region of the active layer;
the above-mentioned description of forming a first through hole in the isolation region by a first etching process on the second insulating layer, and forming a second through hole in the bonding region, which further comprises:
removing the etching stopper layer by a second etching process;
etching the first through hole by a third etching process, to cause the bottom of the first through hole to reach the buffer layer or the substrate;
wherein the first etching process and the third etching process are dry etching, and the gas used in the first etching process and the third etching process are different.

7. The manufacturing method as recited in claim 6, wherein,
the width of the etching stopper layer is smaller than the width of the isolation region.

8. The manufacturing method as recited in claim 6, wherein,
the above-mentioned description of forming a gate on the gate insulating layer corresponding to the pixel region and forming an etching stopper layer corresponding to the isolation region, which comprises:
forming a first metal layer on the gate insulating layer and patterning the first metal layer to form a gate in the pixel region, and forming an etching stopper layer in the isolation region.

9. The manufacturing method as recited in claim 6, wherein,
the above-mentioned description of forming a buffer layer, an active layer, and a gate insulating layer sequentially on the substrate, which comprises:
forming a buffer layer on the substrate;
forming an active layer on the buffer layer and doping the active layer to form the source region and the drain region on the active layer;
forming a gate insulating layer on the active layer.

10. The manufacturing method as recited in claim 9, wherein,
the above-mentioned description of forming a source and a drain on the organic filling layer, which comprises:
forming a third through hole and a fourth through hole on the organic filling layer by a fourth etching process, wherein the third through hole exposes the source region in the active layer and the fourth through hole exposes the drain region in the active layer;
forming a second metal layer on the organic filling layer and patterning the second metal layer to form a source and a drain, wherein the source is connected to the source region via the third through hole, the drain is connected to the drain region via the fourth through hole.

11. The manufacturing method as recited in claim 6, wherein which further comprises:
forming a flat layer on the source and the drain.

12. A display panel wherein comprises a flexible backplate, which made by the method as recited in claim 6.

* * * * *